United States Patent [19]
Craft

[11] Patent Number: 5,184,088
[45] Date of Patent: Feb. 2, 1993

[54] CONTROLLED-GAIN TRANSISTOR AMPLIFIER WITHOUT D-C SHIFT OR SIGNAL PHASE REVERSAL IN LOAD CURRENT

[75] Inventor: Jack Craft, Bridgewater, N.J.

[73] Assignee: Samsung Electronics Co., Ltd., Suwon, Rep. of Korea

[21] Appl. No.: 896,442

[22] Filed: Jun. 10, 1992

[51] Int. Cl.⁵ ............................................. H03F 3/45
[52] U.S. Cl. .................................. 330/254; 330/261
[58] Field of Search .................. 330/9, 252, 254, 258, 330/261

[56] References Cited

U.S. PATENT DOCUMENTS

| | | | |
|---|---|---|---|
| 3,634,620 | 1/1972 | Harford | 358/178 |
| 4,213,151 | 7/1980 | Harford | 358/178 |
| 4,216,436 | 8/1980 | Lefferts | 330/260 |
| 4,471,311 | 9/1984 | Hirata | 329/101 |
| 4,507,682 | 3/1985 | Srivastova | 358/178 |
| 4,602,168 | 7/1986 | Single | 307/355 |
| 4,885,547 | 12/1989 | Bell et al. | 330/254 |
| 4,928,074 | 5/1990 | Sato et al. | 330/254 |
| 5,057,787 | 10/1991 | Arai et al. | 330/254 |

Primary Examiner—Steven Mottola
Attorney, Agent, or Firm—Robert E. Bushnell

[57] ABSTRACT

Signal phase reversal as well as DC shift is avoided in the load current of a controlled-gain transistor amplifier of a type including: first and second transistors connected as a first emitter-coupled differential amplifier; means for applying an input signal voltage between the base electrodes of the first and second transistors; third and fourth transistors connected as a first current splitter, including an interconnection between the emitter electrodes of the third and fourth transistors to which the collector electrode of the first transistor connects; fifth and sixth transistors as a second current splitter, including an interconnection between the emitter electrodes of the fifth and sixth transistors to which the collector electrode of the second transistor connects; means for applying a control signal voltage between the base electrodes of the third and fourth transistors and between the base electrodes of the fifth and sixth transistors; means for applying an operating potential to a first interconnection, which is between the collector electrodes of the third and sixth transistors; and means for applying an operating potential to a second interconnection, which is between the collector electrodes of the fourth and fifth transistors, at least one of which means for applying an operating potential includes an output load. Signal phase reversal is avoided by an improvement which comprises: seventh and eighth transistors connected as a second emitter-coupled differential amplifier, means for applying the input signal voltage between the base electrodes of the seventh and eighth transistors, and means for connecting the collector electrodes of the seventh and eighth transistors to separate ones of the first and second connections.

5 Claims, 5 Drawing Sheets

CONTROLLED-GAIN TRANSISTOR AMPLIFIER WITHOUT D-C SHIFT OR SIGNAL PHASE REVERSAL IN LOAD CURRENT

The invention is related to controlled-gain transistor amplifiers having constant quiescent load current despite change in gain responsive to change in the value of a control signal.

BACKGROUND OF THE INVENTION

The gain of an emitter-coupled differential amplifier connection of first and second transistors of a particular conductivity type can be controlled by supplying the collector current of the first transistor to a first controlled current splitter, by supplying the collector current of the second transistor to a second controlled current splitter identical to the first controlled current splitter, by controlling the first and second controlled current splitters using the same control signal, and by cross-coupling the current splitter output currents for application to the load, thereby to obtain constant quiescent load current despite change in gain responsive to change in the value of the control signal. Each controlled current-splitter comprises a respective pair of emitter-coupled further transistors receiving control voltage between their base electrodes, having the current to be split flowing through an interconnection between their emitter electrodes, and having the split portions of the current flowing through their respective collector electrodes. These third, fourth, fifth and sixth transistors are similar to each other in structure, are proximate to each other within an integrated-circuit, and are of similar conductivity type to the first and second transistors. The foregoing type of gain-controlled amplifier is disclosed in U.S. Pat. No. 4,471,311 issued Sep. 11, 1984 to Hirata and entitled "DETECTOR CIRCUIT HAVING AGC FUNCTION". The foregoing type of gain-controlled amplifier is also disclosed in U.S. Pat. No. 4,928,074 issued May 22, 1990 to Sato et alii and entitled "AUTOMATIC GAIN CONTROL CIRCUIT".

A problem with this gain-controlled amplifier is that as the control voltage between the base electrodes is reduced to zero, any swing past zero causes the controlled-gain amplifier to exhibit increasing gain with an attendant phasing reversal. This characteristic is extremely unattractive in certain applications. For example, in an automatic gain control (AGC) system, under certain conditions this signal-phase-reversal characteristic can undesirably cause the AGC to increase gain rather than decrease gain under strong signal conditions. The just described shortcoming of the previously known gain-controlled amplifier with constant quiescent load current with changes in gain was noticed by the inventor, who sought a controlled gain amplifier in which this shortcoming was overcome without losing the feature of constant quiescent load current with changes in gain and without losing any range in the output voltage swing for given operating supply voltage.

SUMMARY OF THE INVENTION

The invention is embodied in an improvement in a controlled-gain transistor amplifier with constant quiescent load current despite change in gain responsive to a control signal voltage. The controlled-gain transistor amplifier is of a type including: first and second transistors connected as a first emitter-coupled differential amplifier; means for applying an input signal voltage between the base electrodes of the first and second transistors; third and fourth transistors connected as a first current splitter, including an interconnection between the emitter electrodes of the third and fourth transistors to which the collector electrode of the first transistor connects; fifth and sixth transistors as a second current splitter, including an interconnection between the emitter electrodes of the fifth and sixth transistors to which the collector electrode of the second transistor connects; means for applying a control signal voltage between the base electrodes of the third and fourth transistors and between the base electrodes of the fifth and sixth transistors; means for applying an operating potential to a first interconnection, which is between the collector electrodes of the third and sixth transistors; and means for applying an operating potential to a second interconnection, which is between the collector electrodes of the fourth and fifth transistors, at least one of which means for applying an operating potential includes an output load. The improvement comprises: seventh and eighth transistors connected as a second emitter-coupled differential amplifier, means for applying the input signal voltage between the base electrodes of the seventh and eighth transistors, and means for connecting the collector electrodes of the seventh and eighth transistors to separate ones of the first and second connections.

Figure 1:
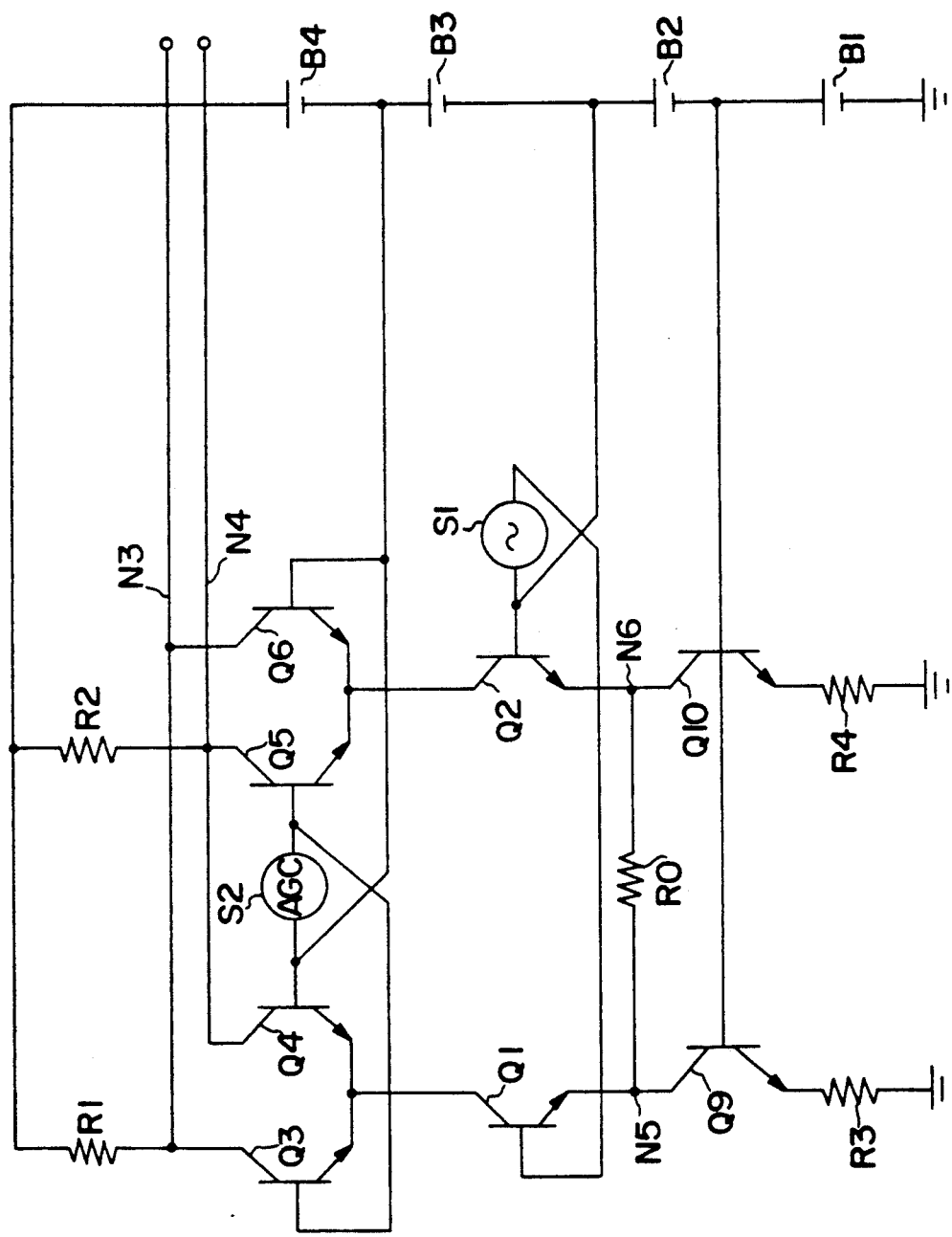
FIG. 1 is a schematic diagram of a prior-art gain controlled amplifier having a constant quiescent load current despite change in gain responsive to change in the value of the control signal setting the value of amplifier gain.
Figure 2:
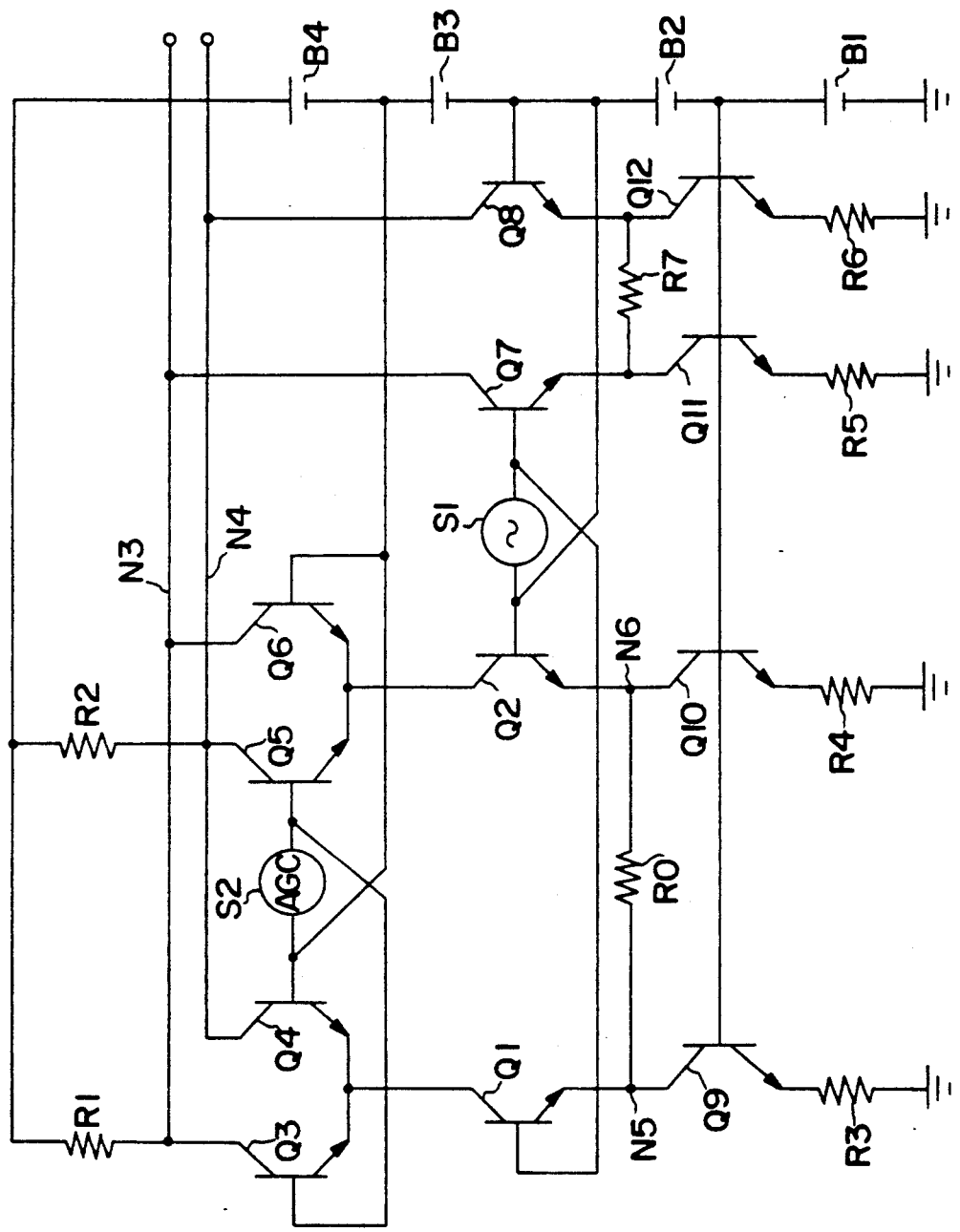
Figure 3:
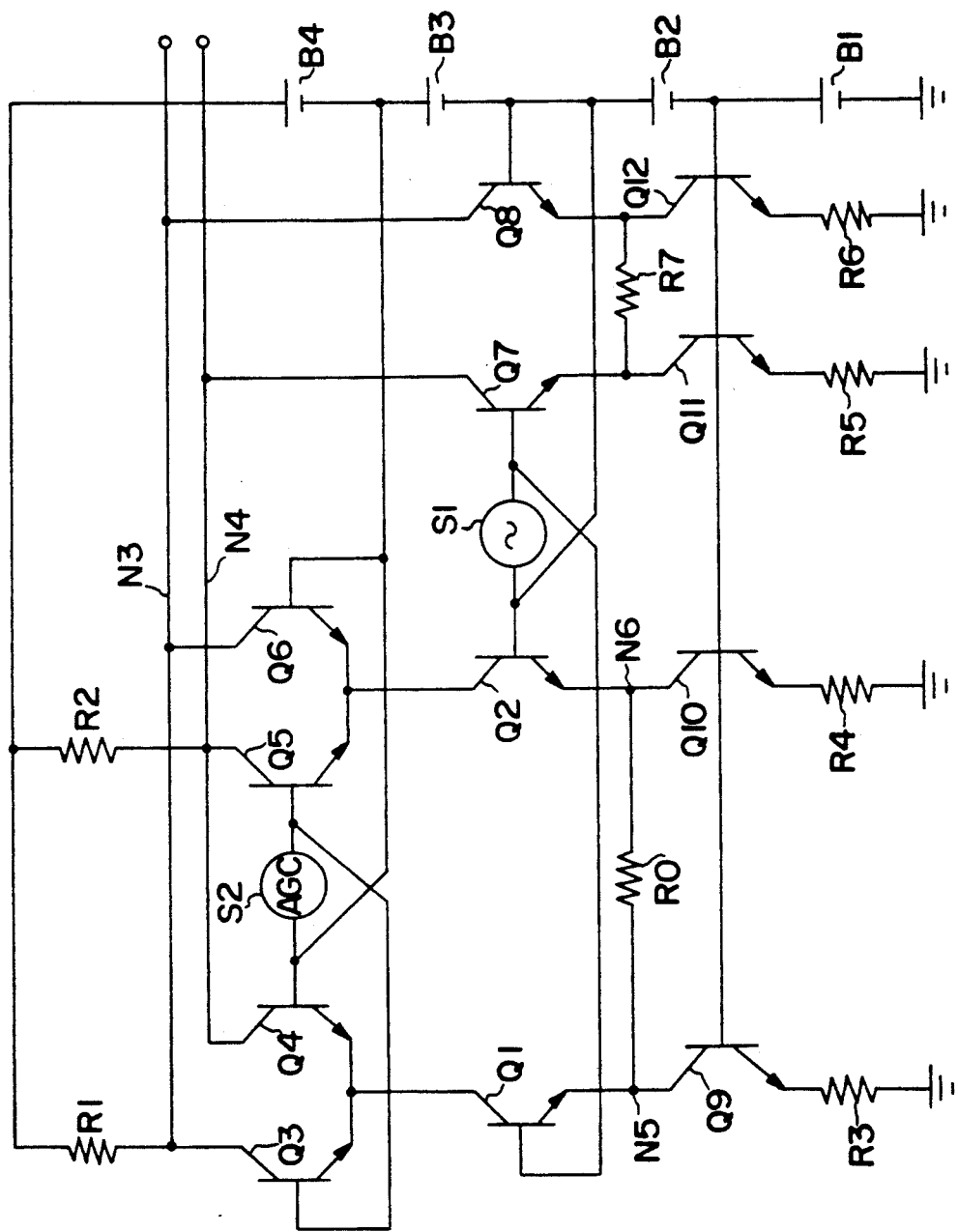

Each of FIGS. 2 and 3 is a schematic diagram of the FIG. 1 gain-controlled amplifier modified to include the improvement of the invention in one of its alternative embodiments.

Figure 4:
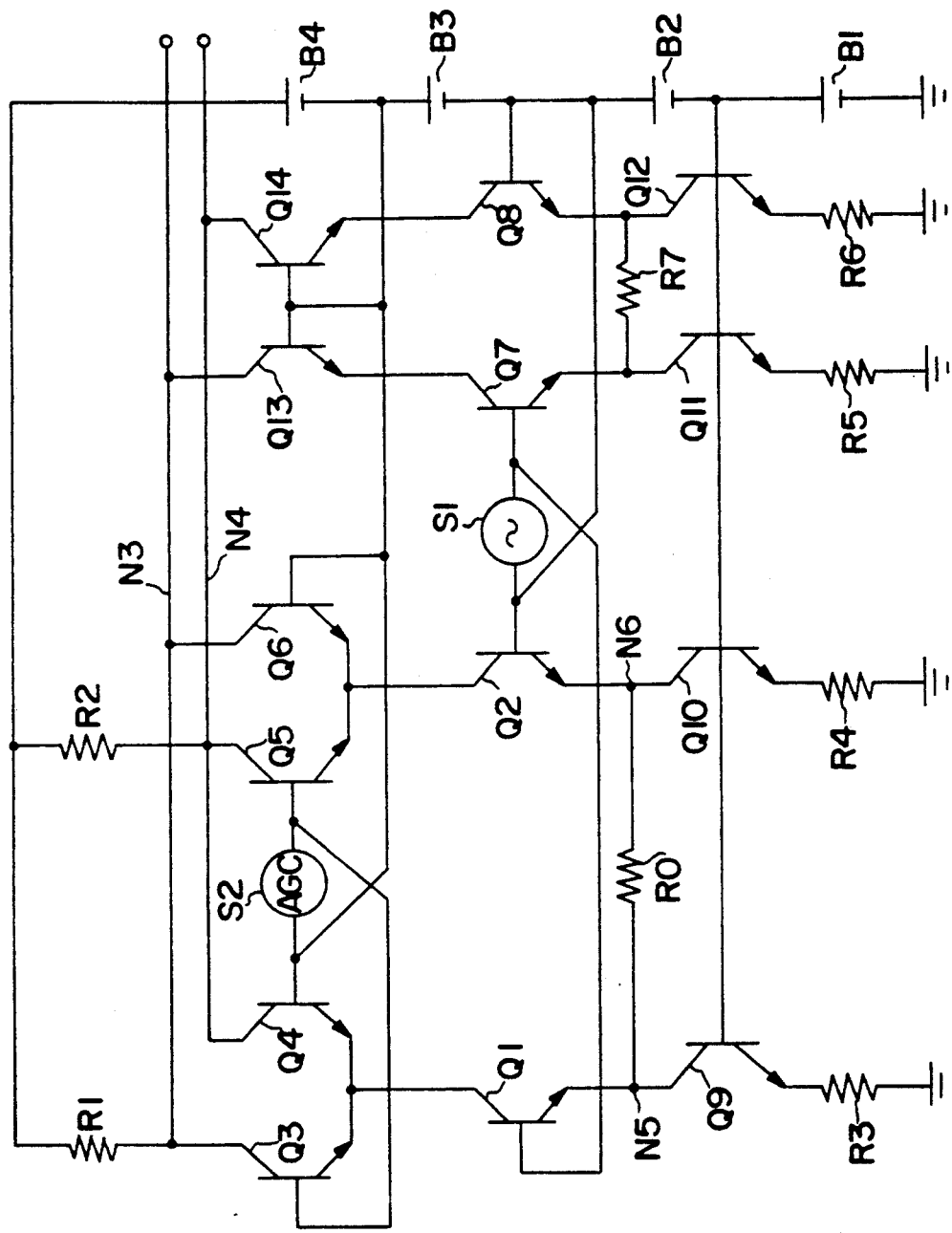

FIG. 4 is a schematic diagram of a further modified FIG. 2 gain-controlled amplifier that includes the improvement of the invention in another of its alternative embodiments.

Figure 5:
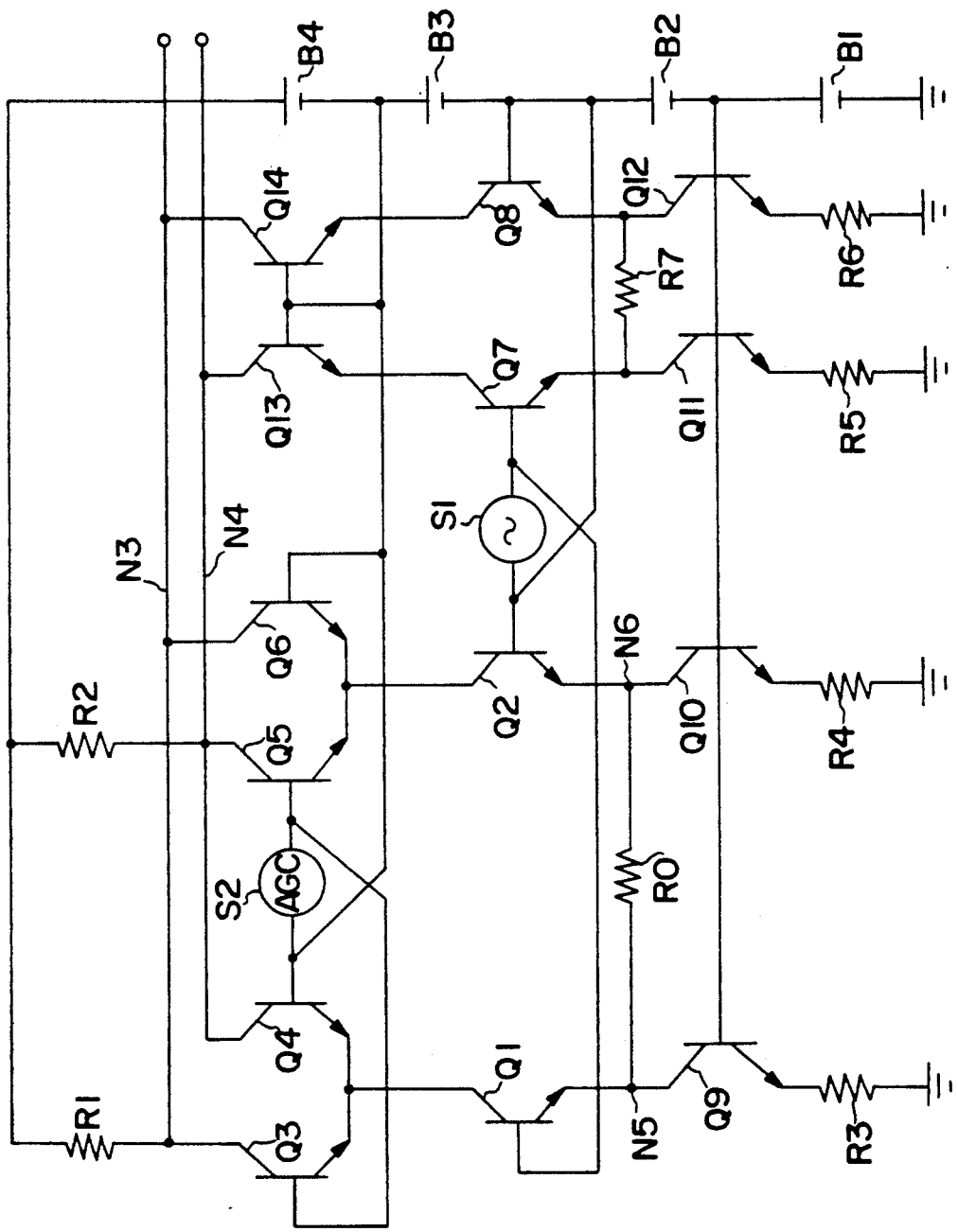

FIG. 5 is a schematic diagram of a further modified FIG. 3 gain-controlled amplifier that includes the improvement of the invention in another of its alternative embodiments.

DETAILED DESCRIPTION

FIG. 1 shows NPN transistors Q1 and Q2 connected in emitter-coupled differential amplifier configuration for demanding collector currents in a ratio determined by an input signal voltage that a source S1 applies between their respective base electrodes. NPN transistors Q3 and Q4 are connected as a first current-splitter, for splitting the collector current demand of Q1 at a node N1 between the emitter electrodes of Q3 and Q4 so as to be supplied as the respective emitter currents of Q3 and Q4 in a ratio determined by a gain control voltage that a source S2 applies between their respective base electrodes. NPN transistors Q5 and Q6 are connected as a second current-splitter, for splitting the collector current demand of Q2 at a node N2 between the emitter electrodes of Q5 and Q6 so as to be supplied as the respective emitter currents of Q5 and Q6 in a ratio determined by the gain control voltage that the source S2 applies between their respective base electrodes.

A resistor R1 connects a node N3 between the collector electrodes of Q3 and Q6 to an operating supply voltage established by the series connection of direct-voltage supplies B1, B2, B3 and B4. R1 provides a shared collector load to Q3 and Q6. A resistor R2 connects a node N4 between the collector electrodes of Q4 and Q5 to the operating supply voltage established by the series connection of direct-voltage supplies B1, B2, B3 and B4. R2 provides a shared collector load to Q4 and Q5.

Similar constant currents are demanded from nodes N5 and N6 in FIG. 1, to which the emitter electrodes Q1 and Q2 respectively connect. An NPN transistor Q9 with an emitter resistor R3 receives at is base electrode the bias voltage from the direct-voltage supply B1 and is thereby conditioned to demand a constant collector current from the node N3. An NPN transistor Q10 with an emitter resistor R4 receives at is base electrode the bias voltage from the direct-voltage supply B1 and is thereby conditioned to demand a constant collector current from the node N4. A resistor R0 connected between nodes N5 and N6 provides combined emitter-degeneration resistances for both Q1 and Q2. This arrangement avoids a direct potential drop across emitter degeneration resistance R0 and conserves operating voltage range.

Alternatively, nodes N5 and N6 may be connected to ground potential through respective resistances rather than Q9 and Q10, providing the direct-voltage supply B1 provides a sufficiently high voltage. In other alternatives, the resistor R0 is center-tapped and constant current is demanded from that center tap rather than constant currents being demanded from nodes N5 and N6. Included in these other alternatives is the special case where the halves of the center-tapped resistor R0 have essentially zero resistances.

In any case the collector currents of Q1 and Q2 are caused to have equal quiescent or direct-current values when the voltage $v_{S1}$ supplied from the source S1 is zero-valued; and the collector currents of Q1 and Q2 exhibit equal-amplitude and opposite-polarity changes $-v_{S1}/R_0$ and $v_{S1}/R_0$ when $v_{S1}$ has a value other than zero, $R_0$ being the resistance of the resistor R0. (The relatively small base currents of the transistors Q1, Q2, Q3, Q4, Q5 and Q6 will be ignored in this brief analysis of operation; and the emitter current of each of these transistors will be assumed to be of substantially the same amplitude as its collector current.) When the voltage $v_{S2}$ supplied from the source S2 is zero-valued, Q3 and Q4 apportion the $-v_{S1}/R_0$ collector current demand of Q1 between them to be supplied in equal measures as their respective emitter currents, and Q5 and Q6 apportion the $v_{S1}/R_0$ collector current demand of Q2 between them to be supplied in equal measures as their respective emitter currents. The $-v_{S1}/2R_0$ emitter current of Q3 and the $v_{S1}/2R_0$ emitter current of Q6 respectively cause a $-v_{S1}/2R_0$ collector signal current demand by Q3 and a $v_{S1}/2R_0$ collector signal current demand by Q6, which collector signal current demands sum to a combined collector current demand of zero by Q3 and Q6 that is to flow through their shared collector load resistor R1. In accordance with Ohm's Law there is zero signal voltage drop across R1 for these conditions of operation. The $-v_{S1}/2R_0$ emitter current of Q4 and the $v_{S1}/2R_0$ emitter current of Q5 respectively cause a $-v_{S1}/2R_0$ collector signal current demand by Q4 and a $v_{S1}/2R_0$ collector signal current demand by Q5, which collector signal current demands sum to a combined collector signal current demand of zero by Q4 and Q5 that is to flow through their shared collector load resistor R2. In accordance with Ohm's Law, there is zero signal voltage drop across R2 for these conditions of operation.

When the direct voltage supplied by the source S1 is positive-valued, the portion of the collector signal current demand of Q1 supplied as emitter current by Q3 increases to a value $(1+\delta)(-v_{S1}/2R_0)$, and the portion of collector signal current demand of Q1 supplied as emitter current by Q4 decreases to a value $(1-\delta)(-v_{S1}/2R_0)$. Also, the portion of the collector signal current demand of Q2 supplied as emitter current by Q5 increases to a value $(1+\delta)(v_{S1}/2R_0)$, and the portion of the collector signal current demand of Q2 supplied as emitter current by Q6 decreases to a value $(1-\delta)(v_{S1}/2R_0)$. The collector signal current demands of Q3 and Q6 are substantially the same as their respective emitter signal currents $(1+\delta)(-v_{S1}/2R_0)$ and $(1-\delta)(v_{S1}/2R_0)$. The $(-\delta v_{S1}/R_0)$ combined collector signal current demands of Q1 and Q6 cause, in accordance with Ohm's Law, a voltage drop of $(-\delta v_{S1}R_1/R_0)$ across the collector load resistor R1 that Q3 and Q6 share, $R_1$ being the resistance of the resistor R1. The collector signal current demands of Q4 and Q5 are substantially the same as their respective emitter signal currents $(1-\delta)(-v_{S1}/2R_0)$ and $(1+\delta)(v_{S1}/2R_0)$. The $(\delta v_{S1}/R_0)$ combined collector signal current demands of Q4 and Q5 cause, in accordance with Ohm's Law, a voltage drop of $(\delta v_{S1}R_2/R_0)$ across the collector load resistor R2 that Q4 and Q5 share, $R_2$ being the resistance of the resistor R2.

As noted in the "Background of the Invention", the polarity senses of the signal voltages across the collector load resistors R1 and R2 are undesirably reversed when the direct voltage supplied by the source S1 is negative-valued. The portion of the collector signal current demand of Q1 supplied as emitter current by Q3 decreases to a value $(1-\delta)(-v_{S1}/2R_0)$, and the portion of the collector signal current demand of Q1 supplied as emitter current by Q4 increases to a value $(1+\delta)(-v_{S1}/2R_0)$. Also, the portion of the collector signal current demand of Q2 supplied as emitter current by Q5 decreases to a value $(1-\delta)(v_{S1}/2R_0)$, and the portion of the collector signal current demand of Q2 supplied as emitter current by Q6 increases to a value $(1+\delta)(v_{S1}/2R_0)$. The collector signal current demands of Q3 and Q6 are substantially the same as their respective emitter signal currents $(1-\delta)(-v_{S1}/2R_0)$ and $(1+\delta)(v_{S1}/2R_0)$. The $(\delta v_{S1}/R_0)$ combined collector signal current demands of Q1 and Q6 cause, in accordance with Ohm's Law, a voltage drop of $(\delta v_{S1}R_1/R_0)$ across the collector load resistor R1 that Q3 and Q6 share, $R_1$ being the resistance of the resistor R1. The collector signal current demands of Q4 and Q5 are substantially the same as their respective emitter signal currents $(1+\delta)(-v_{S1}/2R_0)$ and $(1-\delta)(v_{S1}/2R_0)$. The $(-\delta v_{S1}/R_0)$ combined collector signal current demands of Q4 and Q5 cause, in accordance with Ohm's Law, a voltage drop of $(-\delta v_{S1}R_2/R_0)$ across the collector load resistor R2 that Q4 and Q5 share, $R_2$ being the resistance of the resistor R2.

In FIGS. 2 and 3 NPN transistors Q7 and Q8, like NPN transistors Q1 and Q2 are connected in emitter-coupled differential amplifier configuration for demanding collector currents in a ratio determined by an input signal voltage that the source S1 applies between their respective base electrodes as well as between the respective base electrodes of Q1 and Q2. The emitter circuitry of Q7 and Q8 are substantially the same as the emitter circuitry of Q1 and Q2, with the resistor R7 between nodes N7 and N8 to which the emitter electrodes of Q7 and Q8 respectively connect having the ame restance as R0, with NPN transistors Q11 and Q12 demanding the same constant collector currents from the nodes N7 and N8 as Q9 and Q10 demand from the nodes N5 and N6, and with the emitter degeneration resistors R5 and R6 for Q11 and Q12 having the same resistances as the emitter degeneration resistors R3 and R4 for Q9 and Q10. Q7 and Q8 accordingly demand collector currents $-v_{S1}/R_0$ and $v_{S1}/R_0$ when $v_{S1}$ has a value other than zero.

In FIG. 2 the collector electrodes of Q7 and Q8 connect to nodes N3 and N4 respectively. When the direct voltage supplied by the source S1 is positive-values, in accordance with the Law of Superposition, the component of signal voltage drop $(-\delta v_{S1}R_1/R_0)$ across the collector load resistor R1 owing to the combined collector signal current demands of Q3 and Q6 is augmented by the component of signal voltage drop $-v_{S1}R_1/R_0$ owing to the collector signal current demand of Q7, resulting in a signal voltage drop of $v_{R1} = -(1+\delta)(v_{S1}R_1/R_0)$ across R1. The polarity sense of $v_{R1}$ remains negative over the entire $-1$ to $+1$ range of $\delta$. The component of signal voltage drop $(\delta v_{S1}R_2/R_0)$ across the collector load resistor R2 owing to the combined collector signal current demands of Q4 and Q5 is augmented by the component of signal voltage drop $v_{S1}R_1/R_0$ owing to the collector signal current demand of Q8, resulting in a signal voltage drop of $v_{R2} = (1+\delta)(v_{S1}R_2/R_0)$ across R2. The polarity sense of $v_{R2}$ remains positive over the entire $-1$ to $+1$ range of $\delta$.

In FIG. 3 the collector electrodes of Q7 and Q8 connect to nodes N4 and N3 respectively. When the direct voltage supplied by the source S1 is positive-values, in accordance with the Law of Superposition, the component of signal voltage drop $(-\delta v_{S1}R_1/R_0)$ across the collector load resistor R1 owing to the combined collector signal current demands of Q3 and Q6 is augmented by the component of signal voltage drop $v_{S1}R_1/R_0$ owing to the collector signal current demand of Q8, resulting in a signal voltage drop of $v_{R1} = (1-\delta)(v_{S1}R_1/R_0)$ across R1. The polarity sense of $v_{R1}$ remains positive over the entire $-1$ to $+1$ range of $\delta$. The component of signal voltage drop $(\delta v_{S1}R_2/R_0)$ across the collector load resistor R2 owing to the combined collector signal current demands of Q4 and Q5 is augmented by the component of signal voltage drop $-v_{S1}R_1/R_0$ owing to the collector signal current demand of Q7, resulting in a signal voltage drop of $v_{R2} = (-1+\delta)(v_{S1}R_2/R_0)$ across R2. The polarity sense of $v_{R2}$ remains negative over the entire $-1$ to $+1$ of $\delta$.

As a further guarantee against reversal of the sense of polarity of the controlled signals the resistor R7 may be made so that its resistance $R_7$ is somewhat less than the resistance $R_0$ of the resistor R0. This will reduce somewhat the ultimate signal attenuation available in the controlled-gain amplifier, however. This effect may be used advantageously in delayed AGC systems, it is pointed out.

FIGS. 4 and 5 are modifications of the FIG. 2 and FIG. 3 gain-controlled amplifiers, respectively, in which further common-base amplifier NPN transistors Q13 and Q14 are connected in cascode with respective ones of the emitter-coupled differential-amplifier NPN transistors Q7 and Q8. The base electrodes of Q13 and Q14 are biased similarly to the base electrodes of Q3, Q4, Q5 and Q6 so that the emitter-follower action of Q13 and Q14 places similar collector potentials on Q7 and Q8 as the emitter-follower action of Q3, Q4, Q5 and Q6 place on Q1 and Q2. This slightly improves the matching of the gains of the emitter-coupled differential-amplifier pair Q7 and Q8 to the emitter-coupled differential-amplifier pair Q1 and Q2.

Rather than realizing the second emitter-coupled amplifier using transistors Q7 and Q8 independent of the transistors Q1 and Q2 in the first emitter-coupled amplifier, one may replace Q1 and Q7 by a single first split-collector transistor and replace Q2 and Q8 by a single second split-collector transistor, which first and second split-collector transistors are emitter coupled and driven by a source of input signal voltage applied between their base electrodes. Such equivalent circuits are described by Lefferts in U.S. Pat. No. 4,216,436 issued Aug. 5, 1980 and entitled "HIGH-GAIN DIFFERENTIAL AMPLIFIER" and by Single in U.S. Pat. No. 4,602,168 issued Jul. 22, 1986 and entitled "LOW OFFSET CMOS COMPARATOR CIRCUIT".

The collector load connected to node N3 and the collector load connected to node N4 may take forms other than that specifically shown in the FIGS. 1-3 of the drawing, as one skilled in the art of circuit design will appreciate. Variants of the circuits described are possible from which output signal is taken in single-ended, rather than balanced form, and in which one of the collector loads is replaced by a direct, substantially-impedance-free connection to the operating voltage supply.

While the invention has been described with particular emphasis on bipolar transistor designs to which it is particularly well adapted, the invention may be embodied in equivalent field-effect-transistor circuits. By way of more particular example, in a combined bipolar- and metal-oxide-semiconductor-transistor integrated-circuit technology, the emitter-coupled differential amplifiers employing bipolar transistors may be replaced by source-coupled differential amplifiers employing field effect transistors without departing from the inventive teaching provided by this specification.

One skilled in the art of transistor design and acquainted with the foregoing disclosure will be enabled to design a number of alternative embodiments of the invention and this should be borne in mind when construing the scope of the claims which follow.

What is claimed is:

1. A controlled-gain transistor amplifier with constant quiescent load current despite change in gain responsive to a control signal voltage, said controlled-gain transistor amplifier including:

first, second, third, fourth, fifth and sixth transistors, each having a base electrode, an emitter electrode and a collector electrode;

means for connecting said first and second transistors as a first emitter-coupled differential amplifier including means for applying an input signal voltage between the base electrodes of said first and second transistors;

means for connecting said third and fourth transistors as a first current splitter, including an interconnection between the emitter electrodes of said third and fourth transistors to which the collector electrode of said first transistor connects, and including means for applying said control signal voltage between the base electrodes of said third and fourth transistors;

means for connecting said fifth and sixth transistors as a second current splitter, including an interconnection between the emitter electrodes of said fifth and sixth transistors to which the collector electrode of said second transistor connects, and including means for applying said control signal voltage between the base electrodes of said fifth and sixth transistors;

means for applying an operating potential to a first interconnection, which is between the collector electrodes of said third and sixth transistors, and means for applying an operating potential to a second interconnection, which is between the collector electrodes of said fourth and fifth transistors, at least one of which means for applying an operating potential includes an output load; and the improvement comprising:

seventh and eighth transistors, each having a base electrode, and emitter electrode and a collector electrode; and means for connecting said seventh and eighth transistors as a second emitter-coupled differential amplifier, including means for applying said input signal voltage between the base electrodes of said seventh and eighth transistors, and including means for connecting the collector electrodes of said seventh and eighth transistors to separate ones of said first and second connections.

2. A controlled-gain transistor amplifier as set forth in Claim 1 wherein said means for connecting the collector electrodes of said seventh and eighth transistors to separate ones of said first and second connections is of a type for connecting the collector electrodes of said seventh and eighth transistors to said first connection and to said second connection respectively.

3. A controlled-gain transistor amplifier as set forth in Claim 2 wherein said means for connecting the collector electrodes of said seventh and eighth transistors to separate ones of said first and second connections comprises:

a ninth transistor having an emitter electrode to which the collector electrode of said seventh transistor connects, a base electrode, and a collector electrode connected to said first connection; and a tenth transistor having an emitter electrode to which the collector electrode of said eighth transistor connects, a base electrode, and a collector electrode connected to said second connection; and wherein there is further included means for applying similar direct bias voltage to the base electrodes of said third, fourth, fifth, sixth, ninth and tenth transistors.

4. A controlled-gain transistor amplifier as set forth in Claim 1 wherein said means for connecting the collector electrodes of said seventh and eighth transistors to separate ones of said first and second connections is of a type for connecting the collector electrodes of said seventh and eighth transistors to said second connection and to said first connection respectively.

5. A controlled-gain transistor amplifier as set forth in Claim 4 wherein said means for connecting the collector electrodes of said seventh and eighth transistors to separate ones of said first and second connections comprises:

a ninth transistor having an emitter electrode to which the collector electrode of said seventh transistor connects, a base electrode, and a collector electrode connected to said second connection; and a tenth transistor having an emitter electrode to which the collector electrode of said eighth transistor connects, a base electrode, and a collector electrode connected to said first connection; and wherein there is further included means for applying similar direct bias voltage to the base electrodes of said third, fourth, fifth, sixth, ninth and tenth transistors.

* * * * *